United States Patent [19]

Adcock

[11] Patent Number: 5,008,845
[45] Date of Patent: Apr. 16, 1991

[54] METHOD AND APPARATUS FOR GENERATING A CHIRP SIGNAL

[75] Inventor: James L. Adcock, Seattle, Wash.

[73] Assignee: Hewlett-Packard Company, Palo Alto, Calif.

[21] Appl. No.: 344,777

[22] Filed: Apr. 27, 1989

[51] Int. Cl.$^5$ .................................................. G01V 1/36
[52] U.S. Cl. .................................... 364/576; 367/74
[58] Field of Search ............... 364/576, 422, 553, 718; 367/2, 49, 69, 38, 74, 189

[56] References Cited

U.S. PATENT DOCUMENTS

| | | | |
|---|---|---|---|
| 4,171,466 | 10/1979 | Carbrey | 328/27 |
| 4,202,048 | 5/1980 | Edwards | 364/200 |

OTHER PUBLICATIONS

Kinsel et al., "A Digital Signal Generator"; IEEE Micro; Nov. 1981.
Jawad et al.; "A Novel Technique for Programmed Generation of Multifrequency Composite Sinusiods"; The Radio and Electronic Engineer; Dec. 1978.

*Primary Examiner*—Parshotam S. Lall
*Assistant Examiner*—Ellis B. Ramirez

[57] ABSTRACT

A chirp signal is provided that is characterized by a flat response in the frequency domain. To achieve this response, the signal is made non-flat in the time domain. That is, its amplitude is varied as its frequency is swept. The particular perturbations introduced into the chirp's waveform are typically selected to minimize the waveform's crest factor.

14 Claims, 5 Drawing Sheets

METHOD AND APPARATUS FOR GENERATING A CHIRP SIGNAL

FIELD OF THE INVENTION

The present invention relates to the field of signal generation, and more particularly relates to the generation of a finite chirp signal that is flat in the frequency domain.

BACKGROUND AND SUMMARY OF THE INVENTION

Chirp signals are used in a variety of applications, from radar and oil well logging to electronic and mechanical systems analysis. For expository convenience, the following discussion focuses on one particular application—the use of chirp signals by dynamic signal analyzers to analyze electronic and mechanical systems, although it will be recognized that the invention is not so limited.

Basically, a chirp signal is a sinusoid that sweeps rapidly from one frequency to another. In dynamic signal analyzers, such signals are used to stimulate a mechanical or electronic system under study. The system's response to the chirp can be analyzed to predict the system's response to a multitude of other conditions for which individual testing is impractical. In this particular application, the chirp is typically repeated periodically, with one chirp beginning immediately after the previous chirp is completed.

One desirable feature of chirp signals in this test application is their small crest factor. Crest factor is the ratio of a waveform's peak instantaneous values to its rms value. A one volt rms chirp would typically have a peak voltage of 1.414 volts, so the crest factor is 1.414. (In contrast, another commonly used test waveform, white noise, has a crest factor of three.) In analyzing a system, it is desirable to use as large an input signal as possible in order that the system's response to the signal not be masked by noise in the system or in the instrumentation. However, if the stimulus signal exceeds a certain peak value, the system will distort, corrupting the resulting measurements. Thus, the peak-to-rms ratio for a given waveform determines how much signal power can be provided to the system without it distorting. All else being equal, a chirp will provide more stimulus energy to a system than any other wideband signal type.

More important than the crest factor in most analyses is the requirement that the spectral distribution of energy in the test signal be constant throughout its frequency range. If it is not, then subsequent analysis cannot determine whether a system's particularly strong response at one frequency was due to a resonance at that frequency or whether the stimulus signal simply had a local maximum at that frequency component, prompting an exaggerated response. Another way of stating the requirement is that the test signal should have a perfectly flat response in the frequency domain. While simple to conceptualize in the case of a chirp signal, it is not simple to realize.

The problem with realizing a flat response in the frequency domain is the finite duration of the chirp. An infinite chirp, characterized in the frequency domain by the formula $e^{jkw^2}$, has a perfectly flat response, as does its counterpart in the time domain, $e^{jkt^2}$. However, when the chirp is truncated, its frequency domain representation takes on a $\sin(x)/x$ ripple—$\sin(x)/x$ being the Fourier transform of the finite truncation operator. (Actually the frequency domain response is somewhat further disturbed because the chirp isn't just truncated to a finite section, but then that section is repeated. However, the dominant effect is the $\sin(x)/x$ ripple.) In a typical truncated chirp, different frequency components may differ in magnitude by 6 decibels. This large ripple has generally been considered unavoidable and has simply been tolerated in the prior art, with attendant anomalous results in certain measurements.

According to the present invention, a chirp signal is provided that is characterized by a flat response in the frequency domain. To achieve this response, the signal is made non-flat in the time domain. That is, its amplitude is varied as its frequency is swept. The particular perturbations introduced into the chirp's waveform are typically selected to minimize the waveform's crest factor.

In one method according to the present invention, a chirp signal is produced by generating a sequence of samples according to the formula $e^{jkw^2}$, performing a finite inverse Fourier transform on the sequence to find its counterpart in the time domain, storing digital data corresponding to the transformed sequence in a memory, and then reading the digital data from memory. The resulting digital data stream can be converted directly into analog form to produce a chirp at its baseband frequency, or the digital data stream can be mixed with a digital local oscillator and subsequently converted to analog form to produce a chirp at another, typically higher frequency.

The foregoing and additional features and advantages of the present invention will be more readily apparent from the following detailed description, which proceeds with reference to the accompanying drawings.

DETAILED DESCRIPTION

To provide a comprehensive disclosure without unduly lengthening this specification, applicant incorporates by reference the specification of allowed U.S. application Ser. No. 07/003,158 of Morton and assigned to the present assignee, which provides background material relevant to the present invention.

Figure 1:
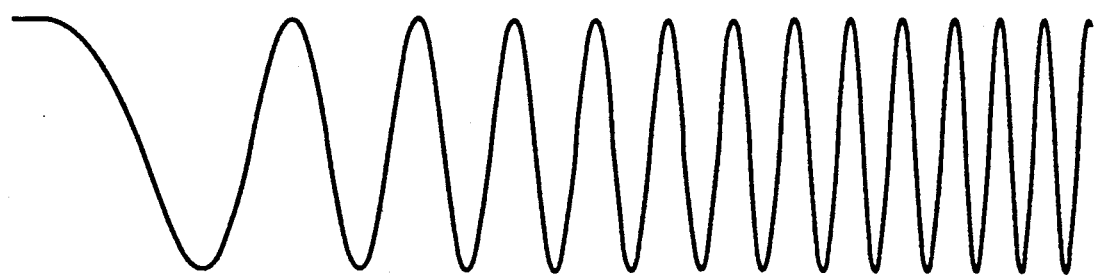
FIG. 1 shows a prior art chirp waveform.

Referring now to FIG. 1, there is shown a conventional, constant amplitude chirp waveform that sweeps from an initial frequency $F_O$ to a final frequency $F_N$. For clarity of illustration, a short chirp spanning only a small frequency range is shown. In practice, the chirp may be much longer and may span tens of octaves. An exemplary chirp lasts four milliseconds and sweeps from DC to 100 kilohertz.

Figure 2:
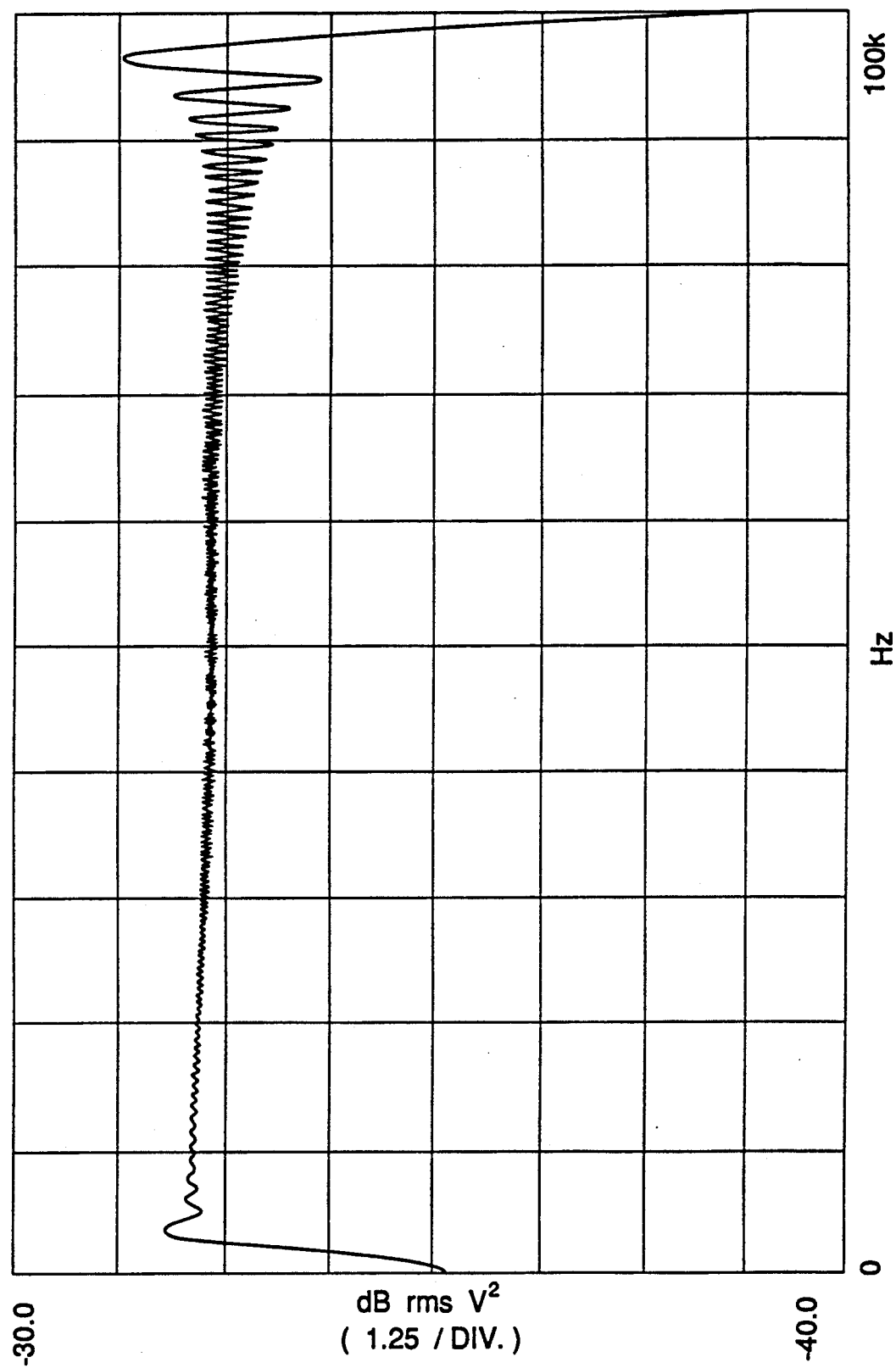
FIG. 2 shows the spectral composition of a prior art chirp waveform.

FIG. 2 shows the spectral composition of the exemplary chirp as actually measured over the DC to 100 kilohertz range. (The curve shows some high frequency rolloff caused by other factors in the measurement system.) As can be seen, the spectrum exhibits a ripple at each end, commonly known as a sin(x)/x ripple, due to the waveform's truncation. This ripple causes the spectral power to vary several dB with frequency. This irregularity corrupts any measurements that rely for their accuracy on a uniform distribution of energy throughout the swept spectrum.

Figure 3:
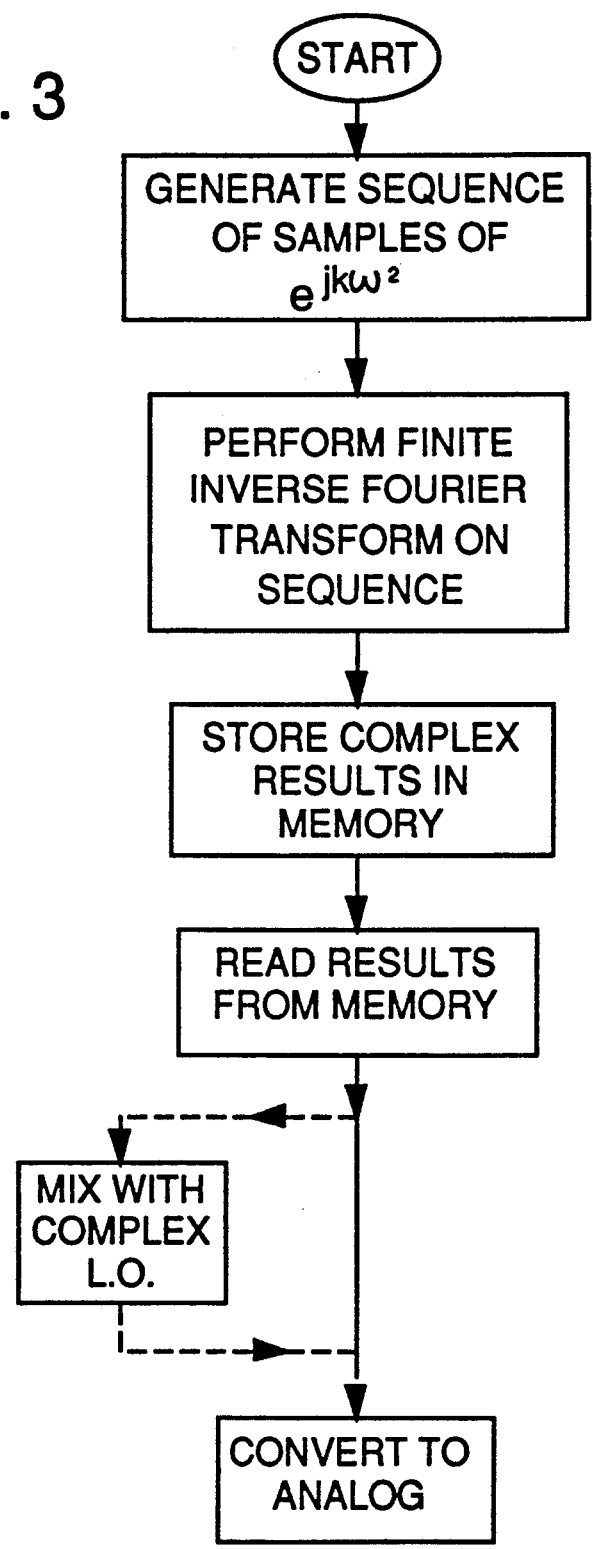
FIG. 3 is a flow chart illustrating a method for generating a chirp according to one embodiment of the present invention.

To eliminate the ripple in the frequency domain, the present invention utilizes a chirp signal that includes the sin(x)/x ripple in the time domain. The particular signal is produced by generating a sequence of samples corresponding to a flat chirp in the frequency domain (i.e. $e^{jkw^2}$), performing a finite inverse Fourier transform on the sequence to find its counterpart in the time domain and then storing this sampled time domain signal in a memory. This signal can then be read from memory and converted into analog form to produce the desired chirp signal at its baseband frequency. Alternatively, the signal can be read from memory and mixed with a digital local oscillator and then converted to analog form to produce a chirp at another, typically higher frequency. This process is illustrated in the flow chart of FIG. 3.

Figure 4:
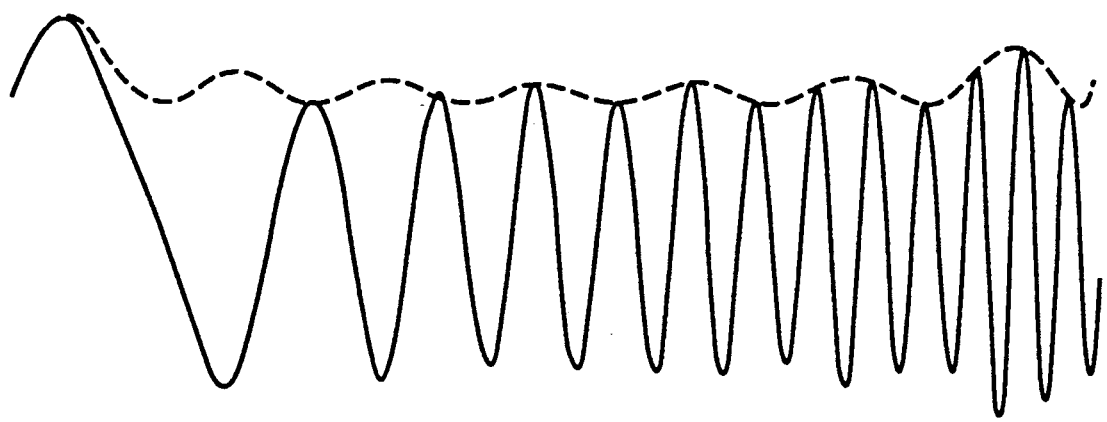
FIG. 4 shows an exaggerated chirp waveform according to one embodiment of the present invention.
Figure 5:
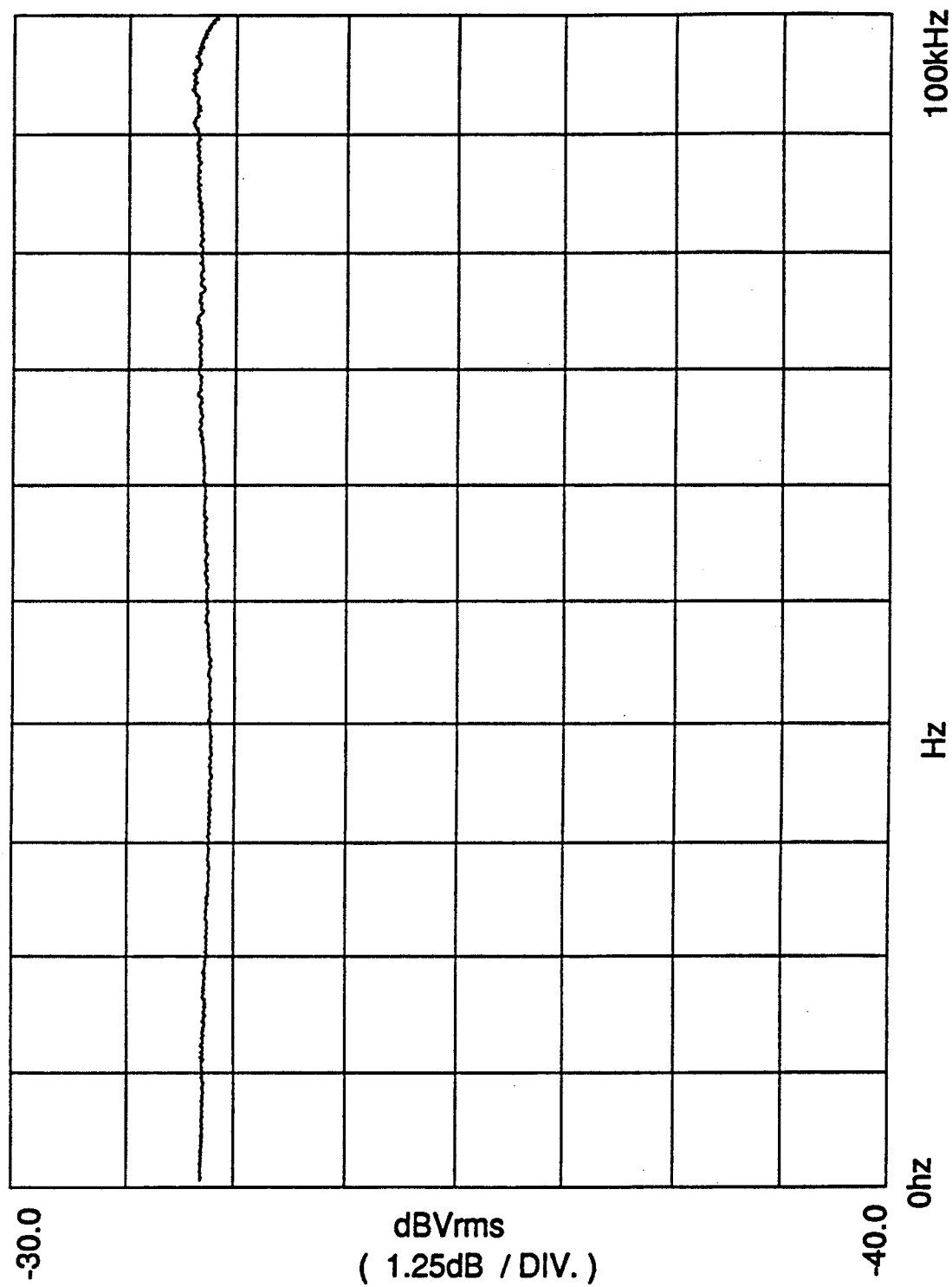
FIG. 5 shows the spectral composition of a chirp according to the present invention.

FIG. 4 shows the results of this process—a chirp signal whose magnitude is modulated by the sin(x)/x ripple (shown in dashed lines). Again, for clarity of illustration, a short chirp spanning only a small frequency range is shown. The frequency domain counterpart to the exemplary chirp that spans zero to 100 kilohertz in four milliseconds as actually measured is shown in FIG. 5 and is flat across the entire swept spectrum.

The discrete Fourier transform used in the above described process is well known. While the procedure is most often performed by software, a number of dedicated Fourier transform apparatuses can also be used. Such apparatuses are shown, inter alia in U.S. Pat. Nos. 4,787,055, 4,763,290, 4,583,190, 4,581,715, 4,534,009 and 4,156,920, the disclosures of which are incorporated herein by reference.

When chirps according to the present invention are cyclically repeated, there is a wraparound component that modulates the high frequency end of the time domain signal with low frequency components, and vice versa. This modulation causes the instantaneous amplitude of the time waveform to vary above and below the ripple imposed by the sin(x)/x ripple. The magnitude of the wraparound components is a function of the quadratic phase ramp in the frequency domain (the $k\omega^2$ term) and is desirably tailored to minimize degradation of the time domain waveform's crest factor. In most applications, the range of frequencies to be swept and the repetition period are fixed. Consequently, the only parameter that can be changed is k in the above equation. This parameter basically controls the speed with which the sweep occurs and, in applications in which the repetition period is fixed, determines the interval between the end of one sweep and the beginning of the next. To yield as high an rms signal as possible, it is of course desirable to minimize this dead time interval. However, as this interval is shortened, the wraparound terms become larger. The ultimate value chosen for k is heuristically determined to minimize degradation of crest factor caused by these two countervailing factors.

In the preferred implementation, three different time domain waveform data sets, obtained from three different FFT computations, are stored in memory and are used or further processed as required. A first data set comprises 1024 real waveform samples that correspond to a flat frequency domain chirp spanning zero to 100 kilohertz. A second data set comprises 1024 complex waveform samples that correspond to a flat frequency domain chirp spanning zero to 50 kilohertz. A third data set comprises 2048 complex waveform samples that correspond to a flat frequency domain chirp spanning zero to 25 kilohertz.

These data sets are used in an illustrative application to provide excitation signals for a Hewlett-Packard 35663 Dynamic Signal Analyzer, which analyzes signals in the zero to 100 kilohertz range. If analysis over the maximum range is desired, data from the first data set is read from memory and converted to analog form to provide the desired excitation chirp. The reason the two additional chirp sequences are provided is that, when outputting a chirp sequence, the instrument holds the same output voltage for a fixed period of time, typically 1/1024 of the time required for the instrument to acquire a full data record. This process of holding the same voltage out of the source for a period of times produces its own little sin(x)/x rolloff. On the full span range (100 kilohertz), a conventional analog reconstruction filter included in the instrument corrects the problem. However, at ranges less than the full span, no specialized filters are usually available. Instead, the sin(x)/x rolloff is corrected for by dividing the original frequency domain representation of the chirp by the sin(x)/x factor. Further, at less than full span, double or quadruple length sequences are desirably used and are "played back" at two or four times the normal rate. By using longer chirp sequences, with higher sampling rates, the first alias terms of the reconstructed chirp are forced further down towards the first null of the sin(x)/x response, resulting in better out of band spur rejection.

The provision of the 50 kilohertz and 25 kilohertz chirp data in complex form permits it to be mixed up to a desired frequency of interest without producing alias terms that must be filtered. For example, data from the second data set can be mixed with complex data from a ten kilohertz local oscillator and the product thereafter converted into analog form to provide an alias-free chirp that sweeps from ten to sixty kilohertz. If analysis over a 25 kilohertz range is desired, the third data set can be used in a similar manner.

For sweeps of less than 25 kilohertz, the third data set can be read from memory at a slower speed to produce a lower frequency chirp. For example, if a 6.25 kilohertz sweep is desired, the third set of data can be read at one quarter the usual speed. (In actual implementation, the data is still read at the nominal clock speed but is read repeatedly—each datum four times—to effect the slower rate). As noted, however, this lower effective sampling rate introduces its own small sin(x)/x ripple that is not removed by the instrument's analog reconstruction filter. This small ripple caused by the repetitive reading of each sample can be eliminated by providing additional data sets corresponding to each sweep range desired if memory space permits. Alternatively, data sets with high sampling rates can be generated "on the fly" as needed for a particular measurement.

Figure 6:
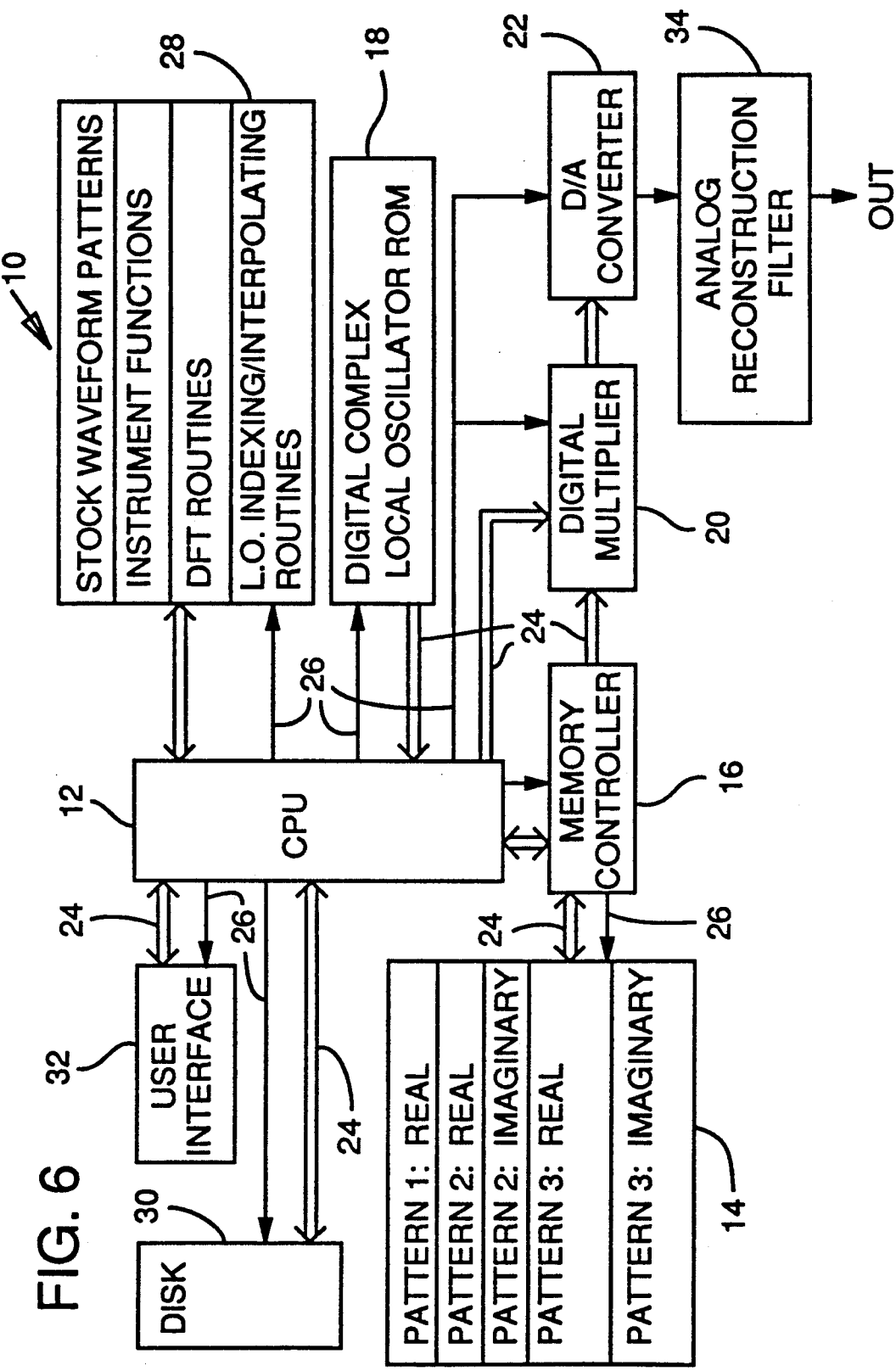
FIG. 6 shows an apparatus for producing a chirp according to the present invention.

An apparatus 10 for producing the chirp waveform is shown in FIG. 6 and is described fully in application serial number 07/345,264 entitled SIGNAL GENERATOR METHOD AND APPARATUS filed on Apr.

27, 1989 (now U.S. Pat. No. 5,001,660). That disclosure is incorporated herein by reference.

Basically, the apparatus 10 of FIG. 6 includes a control microprocessor 12 with associated memory and I/O, a pattern memory 14, a pattern memory controller 16, a digital local oscillator 18, a digital multiplier 20 and a digital-to-analog converter 22. These elements are interconnected by data buses 24 and control lines 26.

The control microprocessor 12 in the illustrated embodiment is a Motorola 68000 series CPU that controls most of the functions of a host instrument in which the signal generator 10 is embodied. Associated with CPU 12 is a ROM memory 28 in which I/O and instrument operation routines are stored. Also included in this memory may be a routine for performing the discrete Fourier transform on a sequence of samples characterizing a flat chirp in the frequency domain. Alternatively, this operation can be performed by an external processor and the results provided to the apparatus on a disk through disk drive 30 or manually entered through a user interface 32. In the preferred embodiment, however, the above-described three chirp sequences are precalculated and are stored in the ROM memory 28. Regardless of their source, the chirp samples are transferred by the CPU 12 during instrument operation into the pattern memory 14, which in the illustrated embodiment is a static RAM. Complex sequences are stored in this memory as separate sequences of real and imaginary samples.

Control microprocessor 12 can be used to control all aspects of the pattern memory's operation. However, in the preferred embodiment, additional memory controller circuitry 16 is provided to reduce the processing burden on the CPU. This controller circuitry includes several subcircuits, such as a Source Address Register, a DMA Load Counter, a RAM Run Counter, a Data Register and an End of Cycle Detector.

The Source Address Resister indicates to the CPU the base address in pattern memory 14 at which to begin loading incoming chirp pattern data. The DMA Load Counter indexes from this base address to indicate the successive memory locations in which bytes of an incoming pattern are to be stored. The Memory Run Counter performs the analogous function during the reading of the chirp pattern from the pattern memory, indexing successive locations in memory from which pattern samples are to be read. The Data Register holds incoming pattern data that is be loaded into the pattern RAM until the RAM is ready to allow the transfer. This register permits the RAM to output a chirp pattern without delaying the CPU if the CPU simultaneously needs to download a new pattern into the RAM. Finally, the End of Cycle Detector selects the length of the pattern that is to be read from the pattern memory. In the illustrated embodiment, the chirp waveform pattern stored in RAM can be 256 to 32768 points long, in powers of two. When the End of Cycle Detector indicates that a complete chirp has been played back, a variety of operations can be initiated. The chirp can be played back from the beginning, causing a repetitive signal to be generated. Alternatively, the waveform can be turned off, causing a "single shot" or transient chirp waveform. Still further, a signal can be sent to the CPU 12 to trigger execution of another function.

Pattern data output from the memory 14 is provided to a digital multiplier 20 that multiplies the chirp data stream with a data stream corresponding to a complex sinusoid from local oscillator 18. Local oscillator 18 is a ROM based source that operates in conjunction with CPU 12 to provide a local oscillator data stream, as described more fully below. The mixing of these two data streams serves to translate the baseband waveform pattern to a higher frequency.

The digital data stream output from the multiplier 20 is converted to analog form using a digital-to-analog converter (DAC) 22. The sin(x)/x ripple introduced by the DAC's holding each output sample a finite interval is as noted, removed by the analog reconstruction filter 34. Filter 34 also serves to suppress sidebands and harmonics of the desired output signal. The filtered analog signal is then output from the instrument for application to the system under test.

As described in greater detail below, the local oscillator data is read from local oscillator ROM 18 at a rate of 262,144 Hz. Since the multiplier 20 is desirably provided with data from both the pattern RAM and the local oscillator ROM simultaneously, the data from the pattern RAM should be provided at the same rate, or at a rate integrally related thereto. I the pattern RAM 14 provides data samples at a rate slower than local oscillator ROM, the pattern RAM should hold its output constant for several of the higher speed (i.e. 262,144 Hz) clock cycles. By this arrangement, a single output datum from the pattern RAM may be sequentially mixed with two or more data from the local oscillator.

This speed at which chirp samples are read from the pattern memory 14 is controlled directly by the CPU 12 and determines both the bandwidth and the period of the baseband waveform. In the illustrated embodiment, the pattern memory can be read at clock rates that are related by powers of two, i.e. 131,072 Hz, 65,536 Hz, 32,768 Hz, etc.

As noted above, local oscillator (LO) 18 is principally comprised of a ROM memory in which samples of a complex sinusoid are stored. To permit the most accurate quantification of the sinusoid within a given memory size, only one quadrant of the complex waveform is stored: the quadrant extending from 0 to $\pi/2$. Waveform samples for the portion of the cycle that extends from $\pi/2$ to $2\pi$ are obtained as follows:

if the phase $\theta$ is between $\pi/2$ and $\pi$, then the complex LO datum corresponding to $(\pi-\theta)$ is read and the imaginary part is negatived;

if the phase is between $\pi$ and $3\pi/2$, then the complex LO datum corresponding to $(\theta-\pi)$ is read and both the real and imaginary parts are negatived; thereof; and if the phase is between $3\pi/2$ and $2\pi$, then the complex LO datum corresponding to $(2\pi-\theta)$ is read and the real part is negatived.

In the preferred embodiment, data points are spaced every 0.0001963 radians over the 0 to $\pi/2$ quadrant, resulting in 8000 real data points and 8000 complex data points. Each point is quantified in a 12 bit byte.

Unlike the RAM pattern memory 14, local oscillator ROM memory 18 is not read at different frequencies to produce sinusoids of different frequencies. Instead, samples are always read from the local oscillator ROM at a fixed frequency, namely 262.144 KHz. Sinusoids of different frequencies are produced by indexing through the sampled data instead of reading it sequentially. The particular sequence of samples read from the ROM is determined by a phase counter implemented in the CPU 12 that indexes through the data by a $\Delta\theta$ term to determine the waveform's cumulative phase $\theta_{TOT}$. $\Delta\theta$ is selected so that the data indexed thereby corresponds to samples of a sine wave of the desired frequency. The CPU 12 calculates $\Delta\theta$ by the formula $\Delta\theta = 2\pi(F_{DESIRED}*T_{CLOCK})$, where $F_{DESIRED}$ is the frequency desired to be generated and $T_{CLOCK}$ is the clock period at which data is read from the ROM, (3.8146972 microseconds in the illustrated 262.144 KHz clock system).

To produce a sinusoid at 2237.89 hertz, for example, the $\Delta\theta$ term is computed by the above formula to be 0.0536389 radians. Since the sinusoid data points are spaced by 0.0001963 radians, a single $\Delta\theta$ increment of 0.0536389 radians corresponds to 273.25 data points. Consequently, the CPU 12 reads from the ROM 18 a sequence of complex sinusoid data points at memory locations 0, 273.25, 546.5, 819.75, 1093, 1366.25, etc., up through the 8000 points stored in memory. (While this sequence starts at location 0, it will be recognized that other sequences could start at other locations.) After the first $\pi/2$ quadrant is exceeded, the process continues up through $2\pi$, with the complex operands in the first quadrant being read from memory and processed as described above to translate them to the proper quadrant. After the cumulative phase $\theta_{TOT}$ exceeds $2\pi$, the CPU subtracts $2\pi$ from the value to bring it back into the 0 to $2\pi$ range.

In the above example, as in most, the $\Delta\theta$ term will sometimes index a fractional memory location (i.e. a signal phase intermediate two data points in the memory). In such cases, the CPU 12 interpolates between the two nearest data points to provide a more accurate output datum. In simpler embodiments the interpolation is linear. In more complex embodiments, the CPU performs a higher order approximation using data points beyond the two nearest. Microprocessor routines embodying the phase indexing and interpolation schemes are stored in the microprocessor's program memory 28.

Having described and illustrated the principles of my invention with reference to a preferred embodiment and method, it will be apparent that the invention can be modified in arrangement and detail without departing from such principles. Accordingly, I claim as my invention all such modifications as may come within the scope and spirit of the following claims and equivalents thereto.

I claim:

1. A method for generating a chirp signal comprising the steps:
   generating a sequence of samples characterizing a flat chirp in the frequency domain according to the formula $e^{jkw2}$;
   performing a finite inverse Fourier transform on said sequence to find the time domain sequence corresponding thereto, said sequence exhibiting a $\sin(x)/x$ ripple therein;
   storing digital data corresponding to said transformed sequence in a memory; and
   reading said digital data from memory to produce an output data stream corresponding to a digitized chirp that is flat in the frequency domain.

2. The method of claim 1 which further includes the steps:
   converting each datum in said output data stream into analog form;
   holding each converted datum for a finite interval; and in which the generating step includes:
   dividing the frequency domain representation of the chirp by a $\sin(x)/x$ factor to correct for a $\sin(x)/x$ ripple that is induced in said signal by the holding of each converted datum for a finite interval.

3. The method of claim 1 which further includes the steps:
   converting each datum in said output data stream into analog form;
   holding each converted datum for a finite interval; and
   filtering from said analog signal a $\sin(x)/x$ ripple that is induced in said signal by the holding of each converted datum for a finite interval.

4. The method of claim 1 in which the storing step includes storing complex data corresponding to said transformed sequence in memory.

5. The method of claim 4 which further includes digitally multiplying said data stream by a complex local oscillator data stream to yield a digitized chirp at a higher frequency.

6. A chirp generator comprising:
   a memory in which is stored a data set corresponding to a sampled chirp, said data set corresponding to a flat chirp if transformed to the frequency domain by a finite Fourier transform but exhibiting a ripple in the time domain;
   memory controller means for reading data from said memory to produce a digitized chirp signal; and
   converter means for producing an analog signal corresponding to said digitized chirp signal.

7. The chirp generator of claim 6 in which the memory contains a complex data set corresponding to the sampled chirp and in which the apparatus further includes means for mixing the digitized chirp signal with a complex digital local oscillator signal to provide a translated version of the digitized chirp at a higher frequency.

8. The chirp generator of claim 6 which further includes means for reading samples from said memory at different rates to yield chirps of different frequencies.

9. The chirp generator of claim 6 in which the memory contains a second data set corresponding to a second sampled chirp and in which the generator further includes means for selecting a data set to be read from the memory by the memory controller means.

10. The chirp generator of claim 9 which further includes means for reading samples from said memory at different rates to yield chirps of different frequencies.

11. The chirp generator of claim 9 in which the second data set is stored in complex form and in which the generator includes means for mixing the digitized chirp signal read by the memory controller with a local oscillator signal to provide a translated version of the selected chirp at a higher frequency.

12. The chirp generator of claim 11 which further includes means for reading samples from said memory at different rates to yield chirps of different frequencies.

13. The chirp generator of claim 9 which further includes:
   means for holding the analog signal corresponding to each digitized chirp signal datum for a finite interval; and
   means for filtering from said analog signal a $\sin(x)/x$ ripple that is induced in said signal by the holding of each analog signal for a finite interval.

14. The chirp generator of claim 6 which further includes a second memory in which is stored said data set corresponding to a sampled chirp and in which the generator further comprises means for transferring said data set from the second memory to the first memory.

* * * * *